(12) United States Patent
Duvvury et al.

(10) Patent No.: US 8,755,158 B2
(45) Date of Patent: Jun. 17, 2014

(54) ESD PROTECTION SYSTEM OPTIMIZED AT BOARD LEVEL

(71) Applicant: Texas Instruments Incorporated, Dallas, TX (US)

(72) Inventors: Charvaka Duvvury, Plano, TX (US); Stephane Bertonnaud, Nice (FR)

(73) Assignee: Texas Instruments Incorporated, Dallas, TX (US)

(*) Notice: Subject to any disclaimer, the term of this patent is extended or adjusted under 35 U.S.C. 154(b) by 42 days.

(21) Appl. No.: 13/706,722

(22) Filed: Dec. 6, 2012

(65) Prior Publication Data
US 2013/0293992 A1 Nov. 7, 2013

(30) Foreign Application Priority Data

May 1, 2012 (EP) .................................. 12290146

(51) Int. Cl.
*H02H 1/00* (2006.01)
(52) U.S. Cl.
USPC ............................................. 361/56; 361/117
(58) Field of Classification Search
USPC ............................................ 361/56, 117–119
See application file for complete search history.

(56) References Cited

U.S. PATENT DOCUMENTS

| 6,606,231 B2* | 8/2003 | Rumer .......................... 361/119 |
| 2009/0154038 A1* | 6/2009 | Dunnihoo et al. ............... 361/56 |

* cited by examiner

*Primary Examiner* — Danny Nguyen
(74) *Attorney, Agent, or Firm* — Wade J Brady, III; Frederick J. Telecky, Jr.

(57) ABSTRACT

An electronic system protected against an incoming energy pulse, comprising a semiconductor device (310a, 310b) connected in sequential order to a first impedance (320), a coupling noise filter (330) having an internal frequency-dependent second impedance (331), a third impedance (340), a transient voltage suppressor (350), a fourth impedance (360), and an entry port exposed to the incoming energy pulse (380). The fourth impedance has a size suitable for supporting the transient voltage suppressor in discharging a portion of the incoming energy pulse up to the full capability of the suppressor; the third impedance has a size suitable for supporting and synchronizing the performance of the coupling noise filter to filter common mode noise from two phase lags between differential signals; and the first impedance has a size suitable for diminishing, in combination with the second impedance as operational in the active frequency regime, the un-discharged portion of the energy pulse to a value under the device threshold failure current.

10 Claims, 5 Drawing Sheets

ESD PROTECTION SYSTEM OPTIMIZED AT BOARD LEVEL

FIELD OF THE INVENTION

The present invention claims priority to and incorporates by reference European Patent Application number EP12290146.5, filed 2012-05-01, entitled "ESD Protection System Optimized at Board Level". It is related in general to the field of semiconductor devices and processes, and more specifically to the concept, quantification, and implementation of system level ESD protection integrated in assembly board and semiconductor device.

DESCRIPTION OF RELATED ART

An electrostatic discharge (ESD) event happens when an object becomes charged (often into the thousands of volts) and then discharges to another object (in currents up to 60 A for few nanoseconds).

Integrated circuits (ICs) and whole electrical systems may be severely damaged by electrostatic discharge (ESD) events. A major source of ESD exposure to ICs is from the charged human body (described by the "Human Body Model", HBM); the discharge of the human body generates peak currents of several amperes to the IC for about 100 ns. A second source is described by the "charged device model" (CDM), in which the product or the IC itself becomes charged (by peak current $I_P$) discharges to ground in rise times less than 500 ps. While these sources are important for components during manufacturing and assembly, a third more severe event is the system level ESD pulse that is applied when the IC components are incorporated in a printed circuit board.

The test methods for these models apply ESD strikes and may show that a system passes when it continues to work without interruption, or is upset by a soft error that corrects on its own, or is locked up by a soft error requiring intervention such as rebooting, or suffers a hard failure by physical damage to the system or device.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

For many years, IC pins have been designed with a variety of ESD protections at the component level. As an example, one common scheme to protect an input/output (I/O) pad against ESD failure uses metal-oxide-semiconductor (MOS) ICs, such as nMOS transistor with its drain connected to the pin to be protected and its source tied to ground, and relies on the mode of a parasitic bipolar transistor (the source acts as the emitter, the drain as the collector, and the bulk semiconductor as the base) during an ESD event to provide a low impedance current path to ground. The protection level or failure threshold can be set by varying the nMOS device width.

The current carrying capability of the device is limited by thermal effects in the avalanching collector depletion layer. A number of effects (such as the increase of intrinsic carrier concentration, a reduction of carrier mobility, a decrease in thermal conductivity, and a lowering of the potential barrier for tunnel currents) contribute to the onset of thermal runaway, the second (thermal) breakdown. The reduction of the impact ionization current is offset by the thermal generation of carriers. Second breakdown, initiated in a device under stress as a result of self-heating, is characterized by the failure (trigger) current $I_{t2}$, which is very sensitive to the device design, especially the doping profiles; it results in junction melting and in an irreversible increase in leakage currents.

Another common protection scheme used in MOS ICs employs a first diode with its cathode connected to the power ($V_{DD}$) terminal for positive ESD stress and its anode connected to the I/O pad to be protected. The diode has to be made of large area, since the on-resistance of the diode determines the effectiveness. A second diode has its anode connected to ground potential ($V_{SS}$) for negative ESD stress and its cathode to the pad.

Electronic devices and ICs are tested for ESD according to HBM and CDM requirements to assure that they can survive manufacture in a controlled ESD environment. After the devices have been implemented in assembly boards and systems, a frequently applied test method for the robustness of the system is the IEC (International Electro-Technical Commission) ESD method, which uses the scenario of a charged human holding a metal object for discharge. The electronics industry is collecting, on an on-going basis, reports and causes of system failures. At present, the analysis of the observed system failures in case studies having both HBM and IEC data indicates no correlation of HBM failure voltage to IEC failure voltage, since in a PCB the HBM should no longer be a threat.

Today's semiconductor industry produces systems on assembly boards which include platforms based on application processors such as OMAP™. These platforms include many exposed high speed digital interfaces (USB, HDMI, SD, MMC, etc.) accessible through external connectors and require, therefore, protection against ESD threats, as manifested for instance by an IEC test pulse. This protection effort has to be structured so that it does not deteriorate the physical channel, or interconnect, in order to maintain the integrity of signals as defined and specified by associated standards. For example, the protection approach has to retain the frequency response of the PCB interconnects, especially since today's USB data rate is scheduled to become faster from year to year (for instance, today's USB2 capability of 480 MB/sec is earmarked to increase to the USB3 capability of 5 GB/sec).

SUMMARY OF THE INVENTION

Applicants observed that for devices inserted in a system, component-level protections against an electrostatic pulse are most often not compatible with a system level pulse, which may be more energetic than a component level pulse. Today, system-level protection against stress is generally not harmonized with component-level protection. Further, the discharge paths and the associated currents in the HBM/CDM and IEC case studies are different for these stress methods, as the lack of correlation of the failure data indicates. In addition, an improved device defense by arbitrarily increasing the component level protection using Zener diode-based clamps and resistors typically reduces interface speed and is thus not recommended. Simply accepting a higher risk of device and thus system failure is generally not an option, either.

Applicants solved the problem of protecting device pins without deteriorating device speed performance by introducing a system-integrated approach with arranging the components in a sequential order and investigating the gradual shrinkage of an ESD pulse in component sequence and including passive connections (impedances) of the printed circuit board (PCB). In a preferred embodiment, the semiconductor device embedded in a system is connected in sequential order to a first impedance, a coupling noise filter with an internal frequency-dependent second impedance, a third impedance, a transient voltage suppressor (TVS), a fourth impedance, and an entry port to the system, which may be exposed to an incoming energy pulse.

Analyzing the fate of an incoming energy pulse, applicants found that the size of the fourth impedance, connecting the port to the board-level external protection clamp (TVS), has to be small enough to support the TVS's discharge of a portion of the incoming pulse up to the full capability of the TVS. After a portion of the arriving pulse energy has been discharged to ground by the TVS, questions are asked whether the component-level internal clamp of the device pin can survive the residual pulse energy. Applicants found that the third impedance, connecting the TVS to the coupling noise filter, has to be small enough to support and synchronize the performance of the coupling noise filter in filtering, with minimum impact on signal integrity, and maximum common noise filtering, common mode noise resulting from two phase lags between differential signals (such as unequal PCB trace lengths or unequal loadings) or EMI pick-up through USB cable. For an embodiment with pins being differential pairs and requiring a high frequency response of the interconnects, the coupling noise filter is a common mode filter (CMF); for another embodiment with pins being non-differential and not requiring high frequency interconnect, the coupling noise filter is a chip ferrite bead (CFB), or alternatively a resistor or a RC filter, for low speed signal lines.

Applicants further discovered that the residual pulse energy can be diminished under the value of the failure current of the device pin by connecting the frequency-dependent impedance (second impedance) of the coupling noise filter with a PCB impedance (first impedance) to the device pin. The size of the first impedance is determined in dependence on the filter impedance, as it is operational in the active frequency regime.

BRIEF DESCRIPTION OF THE DRAWINGS

FIGS. 5A to 5E display five different impedance modes of the common mode filter employed in the circuitry of FIG. 1.

FIG. 5B shows the Common Mode.

DETAILED DESCRIPTION OF THE PREFERRED EMBODIMENTS

Figure 1A:
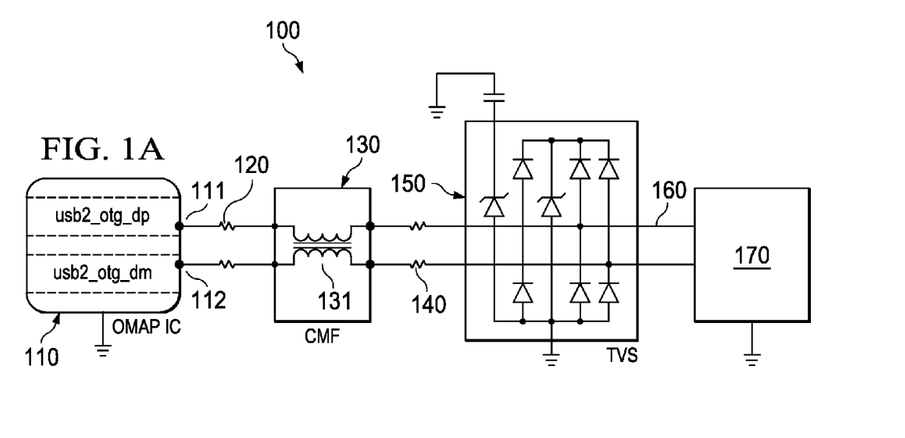
FIG. 1A shows the circuit diagram of an embodiment of the invention as assembled on a printed circuit board; the coupling noise filter is a common mode filter suitable for device pins requiring an interconnect with a high frequency response.

FIG. 1A presents an electrical diagram of an exemplary embodiment of the integrated ESD protection approach for a semiconductor device assembled in an electronic system. As an example, the system, generally designated 100, may be assembled on a printed circuit board (PCB). The goal of the protection approach is to minimize the residual pulse entering the device, after a portion of the original pulse has been discharged to ground, below the threshold failure current $I_f$ of the device pin. The function of discharging a portion of the original pulse to ground is assigned to a transient voltage suppressor TVS (that may include Zener diodes); the function of minimizing the residual pulse is assigned to a coupling noise filter (common mode filter CMF or chip ferrite bead CFB) in combination with PCB-provided wiring interconnects (and their equivalent electrical characteristics) and load terminations. The essential components of the system in FIG. 1A are in schematic and simplified fashion repeated and highlighted in the analogous diagram of FIG. 1B. System 100 includes a plurality of components connected by a plurality of impedances in the following specific sequential order.

Figure 1B:
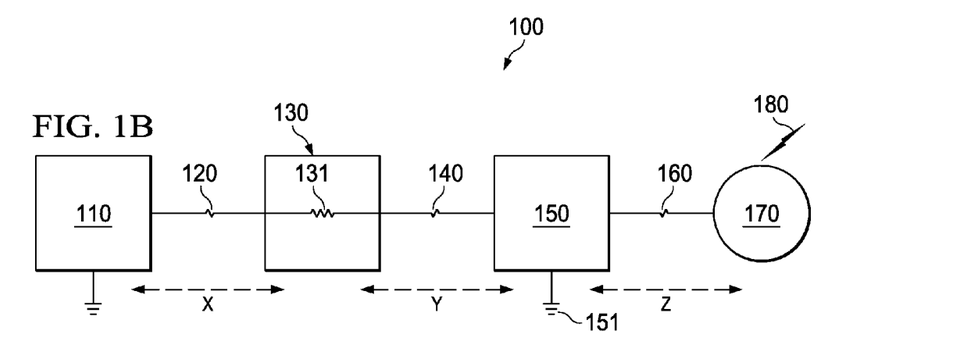
FIG. 1B shows a simplified layout of the diagram of FIG. 1A, highlighting the sequential order of the components and interconnecting impedances.

The selected exemplary device 110 from the OMAP™ processor family has integrated the Data pins of USB2 interface: DP (designated 111) and DM (designated 112); both pins require an interconnect with a high frequency response and have device-internal ESD protections to ground. Device 110 is characterized by threshold failure current $I_f$ for pins 111 and 112. Device 110 is coupled by first impedance 120 to a coupling noise filter 130 suitable for high frequency differential signals. In FIG. 1B, interconnecting first impedance 120 is referred to as X. The preferred embodiment of first impedance 120 is a 90Ω differential line impedance. For a device of the OMAP™ family, coupling noise filter 130 is preferably selected as a common mode filter (CMF). As shown in FIG. 1A, the preferred way of connecting CMF 130 is in between IC and TVS. The behavior under an IEC event is well described by the so-called "load mode" (this mode and other modes are discussed below). A second impedance, designated 131, is internal to common mode filter CMF. Second impedance 131 is dependent on the connection mode of CMF and also on the frequency range used in operating CMF (see FIG. 5).

First impedance 120 (differential line impedance) is defined by standards; the quoted 90Ω, required by USB standards, derive from line width/line spacing for a given PCB stack-up. However, under an IEC event, the interconnect terminated by a small impedance (the on-resistance of the on-chip protection) is equivalent to an inductance (the effective inductance proportional to the line length) and a resistance (RLC). Consequently, longer interconnections are better, up to the onset of resonance. First impedance 120 works in combination with second impedance 131, which operates with the value according to the active CMF frequency regime. The combination of first impedance 120 and second impedance 131 has a size suitable to diminish the un-discharged portion of the energy pulse to a value under the device threshold failure current $I_f$.

In the sequence of components, FIG. 1A shows next a third impedance 140, which interconnects CMF 130 and transient voltage suppressor TVS 150. Third impedance 140 is suitable for supporting and synchronizing the performance of CMF 130 so that filter 130 is enabled to filter common mode noise from two phase lags between differential signals. In the preferred embodiment, third impedance 140 is a resistive trace integral with the PCB. Impedance 140 should be small for several reasons: It should not interfere with the phase lag to impedance 120, i.e. it should not recreate or renew a phase lag which has already been filtered out by CMF 130. In quantitative terms, third impedance 140 should preferably be small, keeping the line connection at short length, to enable filtering of the residual pulse by the CMF and blocking ESD energy as soon as possible. Further, impedance 140 should mitigate impedance disruption due to parasitic capacitance of the TVS 150. In FIG. 1B, interconnecting third impedance 140 is referred to as Y. While first impedance 120 is selected to optimize the reduction of the residual pulse, third impedance 140 is selected to enable peak performance of the coupling noise filter 130. Interconnects 140 and 160 are designed to result in minimum phase lag.

Next in the sequence of components of FIG. 1A are transient voltage suppressor TVS (150) and its line impedance 160 to system entry port 170. Since the function of TVS 150 is to discharge to ground 151 as high a portion of the arriving energy pulse 180 as possible, the impedance of connection 160, herein referred to as fourth impedance, preferably has a size suitable for supporting TVS 150 in discharging the portion of the incoming energy pulse up to the full capacity of suppressor 150. In quantitative terms, fourth impedance 160 should preferably be as small as possible. In FIG. 1B, interconnecting fourth impedance 160 is referred to as Z. When fourth impedance Z is provided by a trace integral to the PCB, a small size of Z can be obtained by positioning TVS 150 in close proximity to entry port 170, keeping the line connection at short length in order to block ESD energy as much as possible close by the entry port. Line impedance 160 is designed for 90Ω differential line impedance (per USB standards); on the other hand, a design for higher line impedance than 90Ω of trace 160 would facilitate tuning out the parasitic capacitance of the TVS.

Figure 2A:
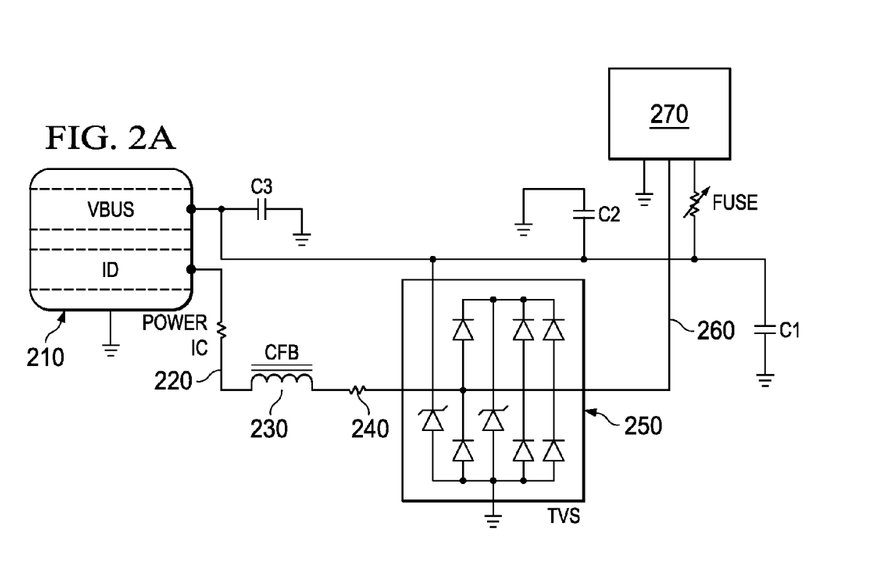
FIG. 2A depicts the circuit diagram of another embodiment of the invention as assembled on a printed circuit board; the coupling noise filter is a chip ferrite inductor (chip ferrite bead) suitable for device pins not requiring high frequency response.
Figure 2B:
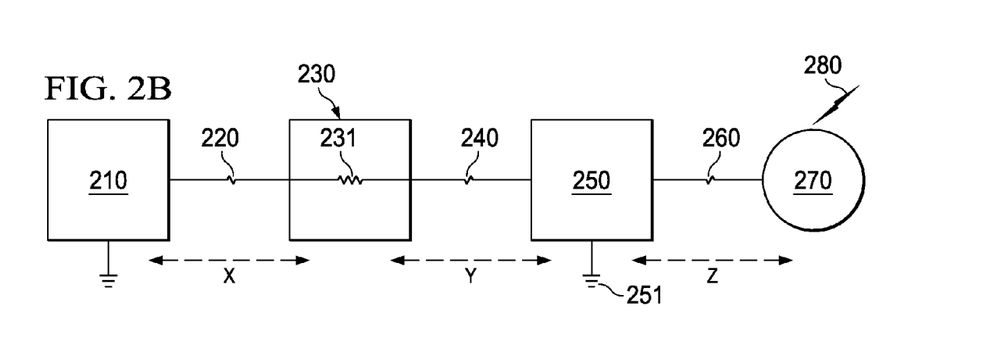
FIG. 2B depicts a simplified layout of the diagram of FIG. 2A, highlighting the sequential order of the components and interconnecting impedances.

Another exemplary embodiment is illustrated in FIGS. 2A and 2B showing electrical diagrams of an integrated ESD protection approach for a semiconductor device 210, such as a Power integrated circuit (IC), which has pins not requiring high frequency response for pins VBUS and ID. Device 210 has device-internal ESD protection to ground. As in FIGS. 1A and 1B, the goal of the protection approach is to minimize the residual pulse entering device 210, after a portion of the original pulse has been discharged to ground, below the threshold failure current $I_f$ of the device pins VBUS and ID. The function of discharging a portion of the original pulse 280 to ground is assigned to a transient voltage suppressor TVS (Zener diodes) 250; the function of minimizing the residual pulse is assigned to a coupling noise filter (chip ferrite bead CFB) 230 in combination with PCB-supplied impedance 220. The components of the system are connected in the following specific sequential order.

The selected exemplary device 210 from the Power integrated circuit family has pins (VBUS and ID), which do not require high frequency response; the pins have device-internal ESD protections to ground. Device 210 is characterized by threshold failure current $I_f$. Device 210 is coupled by first impedance 220 to a coupling noise filter 230 suitable for device pins (like pin ID), which do not require high frequency response. In FIG. 2B, interconnecting first impedance 220 is referred to as X. The preferred embodiment of first impedance 220 is a trace integral with the PCB. For a device of the Power family, coupling noise filter 230 is preferably selected as a chip ferrite bead (CFB). Components such as CFB exhibit a high impedance especially for the fast transient portion of a residual pulse, but can be used only for slow signal pins such as ID (more about chip ferrite beads below). CFB can be any combination of low pass filter such as RC, LC, and RLC, for single-ended and low-frequency signals.

A second impedance, designated 231, is internal to chip ferrite bead CFB. Second impedance 231 is dependent on the frequency range used in operating CFB. First impedance 220 is frequency dependent (RLC), its size can be deliberately selected; optimum placement of the CFB on the PCB determines the effectiveness of the ESD protection. Optimum placement is between the IC-pin-to-protect and TVS 250. The combination of first impedance 220 and second impedance 231, which operates with the value according to the active CFB frequency regime, are selected to diminish the un-discharged portion of the energy pulse to a value under the device threshold failure current $I_f$.

In systems assembled on a PCB without any extra filtering devices, such as CFB, CMF, or other filtering devices, it is exclusively the interconnection on the PCB, i.e. the first impedance designated X in FIGS. 1B and 2B, which needs to be selected to diminish the un-discharged portion of the energy pulse to a value under the threshold failure current $I_f$ of the IC device-to-be-protected, while maximum energy is dumped to ground by the TVS. In this case without extra filtering devices, the impedances 131 and 140 in FIG. 1B and the impedances 231 and 240 in FIG. 2B are not introduced. The impedances 120 in FIGS. 1B and 220 in FIG. 2B are frequency dependent (RLC) and predominantly PCB interconnections; they are herein referred to as "layout" impedances. The impedances 160 in FIGS. 1B and 260 in FIG. 2B are herein referred to as "tying" impedances.

In the sequence of components, FIG. 2A shows next a third impedance 240, which interconnects CFB 230 and transient voltage suppressor TVS 250. For the pins VBUS and ID with single ended signal, signal integrity and EMI generation from phase lag between differential pairs are not a concern. Consequently, third impedance 240 is not critical except it should aim to lower the residual pulse after passing through the CFB 230. In the preferred embodiment, third impedance 240 is a resistive trace integral with the PCB. In FIG. 2B, interconnecting third impedance 240 is referred to as Y. While first impedance 220 is selected to optimize the reduction of the residual pulse, third impedance 240 is selected to enable peak performance of the coupling noise filter 230.

Next in the sequence of components of FIG. 2A are transient voltage suppressor TVS (250) and its connection 260 to system entry port 270. Since the function of TVS 250 is to discharge to ground 251 as high a portion of the arriving energy pulse 280 as possible, the impedance of connection 260, herein referred to as fourth impedance, is preferably selected for supporting TVS 250 in discharging the portion of the incoming energy pulse up to the full capacity of suppressor 250. In quantitative terms, fourth impedance 260 should preferably be as small as possible. In FIG. 2B, interconnecting fourth impedance 260 is referred to as Z. When fourth impedance Z is provided by a trace integral to the PCB, a small size of Z can be obtained by positioning TVS 250 in close proximity to entry port 270, keeping any extra resistance small.

Figure 3:
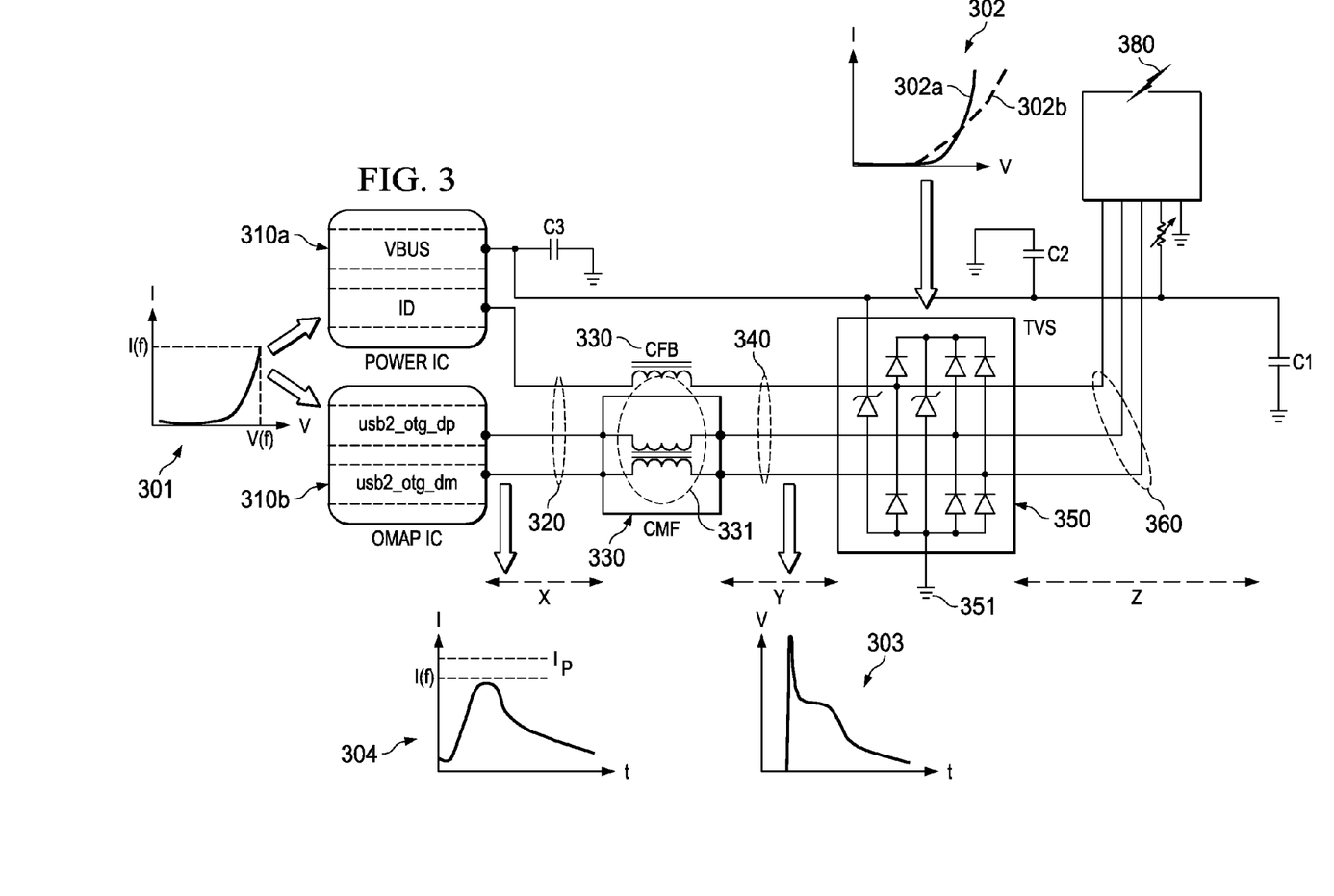
FIG. 3 illustrates a circuit diagram combining FIGS. 1A and 2A and inserting additional plots showing time-dependent characteristics of voltage and current at stations used for an analytical model.

FIG. 3 combines FIGS. 1A and 2A into a unified circuit diagram while adding at selected stations informative plots of electrical parameters in order to facilitate investigations of the weakening residual pulse. The depicted plots represent examples, which can be varied in ways familiar to persons skilled in the art. The examples of FIG. 3 include an incoming energy pulse 380 at entry port 370, which may be a +8 kV, 30 A, 100 ns test pulse as defined by the International Electro-Technical Commission (IEC). The peak current of 30 A may last for 1 ns and the bulk current of about 15 A average may last for 60 ns. The area under the current-time characteristic indicates the amount of electrical charge of the pulse; the amount of charge multiplied by the voltage delivers the impinging pulse energy. The devices-to-be-protected are a Power IC designated 310a and an OMAP™ IC designated 310b, having USB input/output pins. For each of these devices, a current-voltage plot of the pulse from the charged device model (CDM) data measures the peak current $I_p$, and a current-voltage plot of the pulse from the transmission line pulse (TLP) 100 ns data measures the failure current $I_f$. In FIG. 3, the depicted current-voltage plot is designated 301.

In the plot designated 302, the current-voltage behavior of the TVS 350, characterized by Zener diodes, is measured with TLP. Plot 302 demonstrates the effect of impedance 360, also denoted Z, of the connection between TVS 350 and entry port 370: A small value of impedance 360 results in curve 302a, a greater value of impedance 360 results in curve 302b. As the plot shows, a higher voltage is needed for curve 302b with the larger impedance 360 to reach the same current, than is needed in curve 302a with the smaller impedance 360; a small impedance 360 supports an effective operation of the TVS.

Simulations are performed in the voltage-time plot designated 303 to model the TVS response to pulse 380. An efficient TVS discharges a significant portion of the original pulse to electrical ground 351, thus reducing the impinging energy by the discharged amount; as stated, the remaining pulse energy is herein referred to as residual pulse, ready to arrive like a transmission line pulse (TLP) at the input/output pins of devices 310a and 310b. However, while impedance 340 is sized to enable peak performance of the coupling noise filter (USB filters CMF or non-USB filters CFB) 330, impedance 320 is sized to optimize the reduction of the residual pulse. In FIG. 3, impedance 340 is also denoted Y, and impedance 320 is also denoted as X. As discussed above, it is effectively the combination of impedance 320 and the frequency-dependent impedance 331 internal to coupling noise filter 330, which diminishes the residual pulse.

In plot 304, the residual pulse current I is displayed as a function of time t. A fresh curve can be plotted for each value of the combination of impedances 320 and 331. Since impedance 331 is internal to noise filter 330, but impedance 320 can be selected as a trace inductance and resistance of the PCB, a fresh curve current vs. time can be obtained for each choice of board design. After selecting a relatively large value of impedance 320, the residual pulse current in plot 304 will eventually be below the failure current $I_f$. When the residual pulse current is also below failure trigger current $I_{t2}$, the pin of device 310a or 310b can pass the required ESD stress test.

Figure 4:
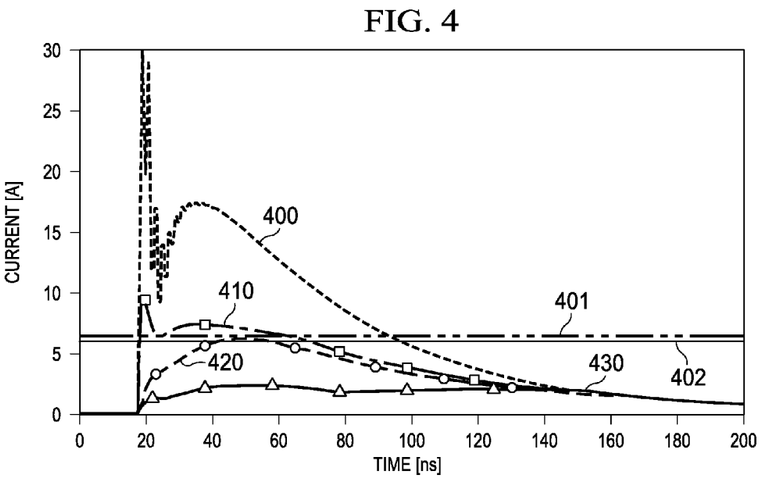
FIG. 4 summarizes exemplary protection results for the semiconductor device under various system configurations of the components employed in the protection circuit of FIG. 3.

The contribution of each component of FIG. 3 to the successful ESD protection strategy for device pins requiring high frequency response (OMAP™ IC 310b) and device pins not requiring high frequency response (Power IC 310a), is illustrated in exemplary FIG. 4. An IEC pulse stress of >8 kV is applied to the system entry port, and then the current (in amperes) arriving at a device USB pin is plotted as a function of time (in nanoseconds). The tolerance limit of the device pin is indicated by the horizontal line designated 401, marking the $I_{t2}$ limit according to transmission line pulse (TLP) data, and by the horizontal line designated 402, marking the $I_p$ limit according to charged device model (CDM) data.

Curve 400 in FIG. 4 refers to the arriving current at a device USB pin, when only the inductive/resistive traces on the PCB are used as pulse protection. Curve 400 indicates that the board layout does not offer any ESD protection for the tested device pin. Curve 410 refers to the arriving current when the transient voltage suppressor (TVS) is exclusively used for protection. As can be seen, using the TVS improves the protection considerably, but not yet enough. Additional improvement is obtained—see curve 420—when the TVS is combined with the parasitics of the layout on the PCB. As curve 430 shows, sufficient protection is achieved after the common mode filter (CMF) is inserted into the sequence of components and its impedance is added to the impedances of the PCB layout.

Figure 5A:
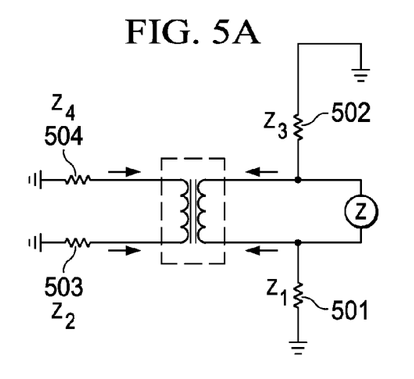
FIG. 5A shows the Load Mode.
Figure 5B:
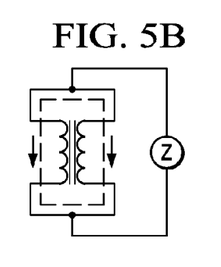
Figure 5C:
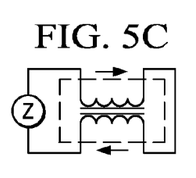
FIG. 5C shows the Differential Mode.
Figure 5D:
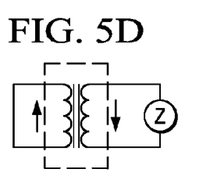
FIG. 5D shows the Normal Mode.
Figure 5E:
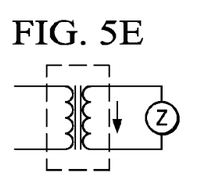
FIG. 5E shows the Open Mode.
Figure 6:
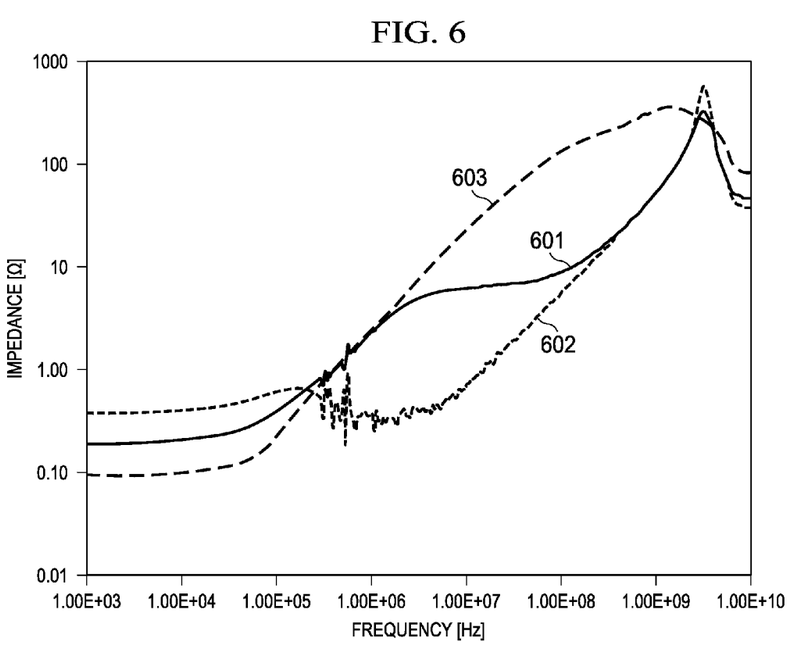
FIG. 6 illustrates exemplary frequency-dependent impedances of the common mode filter for the various modes displayed in FIGS. 5A to 5E.

For inserting the common mode filter (CMF) into the sequence of protective components assembled on the PCB, several impedance modes provide successful embodiments. The schematic layouts of FIGS. 5A to 5E represent a plurality of CMF impedance modes, which have been used in embodiments, and FIG. 6 illustrates the impedance behavior (in ohms) of some of these modes as a function of frequency (in Hertz). In FIGS. 5A to 5E, the arrows represent current flow, and Z refers to impedance, which includes frequency-independent resistance plus frequency-dependent values from inductance and capacitance. For the case of USB pins, the CMF is primarily used to minimize common mode noise that can be generated from unbalanced signal lines, but its impedance behavior also helps to mitigate the residual pulse of an ESD event.

Since signals are differential, the CMF is always connected with its four terminals. The location of the CMF in the line-up on the PCB is decisive. Under an IEC event, the electrical characteristic of the load mode configuration is representative of the over-all line-up. Since the effective impedance of the CMF depends on how it is used, it gives the best resistance values for the ESD pulse, without any effect on the USB performance, in the so-called Load Mode, where it acts as a transformer. The Load Mode as the preferred CMF mode is shown in FIG. 5A and has been used in FIGS. 1A and 3. Other modes, which are useful for other embodiments, include the Common Mode in FIG. 5B, the Differential Mode in FIG. 5C, the Normal Mode in FIG. 5D, and the Open Mode in FIG. 5E. The Load Mode is useful for ESD protection designs where the CMF acts as a transformer and contributes significantly to raise the channel impedance. The primary of the CMF has the PCB wiring interconnect, equivalent to the inductance and resistance of the traces, and the turn-on resistances of on-chip and off-chip protections. These impedances are represented in FIG. 5A by $Z_1$ (501) and $Z_3$ (502). The secondary of the CMF has impedances $Z_2$ (503) and $Z_4$ (504) as terminations. Under an IEC event, the channel impedance of the primary is raised by $Z_2+Z_4$.

As displayed in FIG. 6 by curve 601 for balanced terminations, the primary channel impedance between resistances 501 and 502 (FIG. 5A) exhibits various impedance modes along the frequency range: From DC to 1 MHz, the impedance is about equal to the Common Mode impedance for the Common Mode shown in FIG. 5B; from 2 MHz to above 2 GHz, the CMF acts as a transformer with increased effective value of the resistance. In this transformed mode, the impedance of the primary loop (between resistances 501 and 502) is therefore the load of the secondary loop added to the Differential Mode impedance. The load of the secondary loop is formed by the PCB trace interconnect (inductance/resistance) and the on-resistances of the on-chip and off-chip protections. Consequently, the Load Mode is most useful for ESD protection in the regime where the CMF acts as a transformer. By raising the primary impedance, the Load Mode provides a higher effective impedance for the residual pulse than the other CMF modes.

The impedance of the Differential Mode (see FIG. 5C) characterizes the impedance presented to differential signals. The Differential Mode impedance is shown in FIG. 6 by curve 602. The Common Mode (see FIG. 5B) impedance is seen by Common Mode signal; it is displayed in FIG. 6 by curve 603. Normal Mode (see FIG. 5D) and Open Mode (see FIG. 5E) are both quite similar to Differential Mode (see FIG. 5C) and Common Mode (see FIG. 5B).

The contribution of the coupling noise filter, especially the common mode filter CMF, to ESD protection as displayed in FIGS. 4 to 6 points out that under an ESD stress to the system, the CMF acts as a transformer wherein the impedance of the primary (the stressed channel) is raised by the load of the secondary. When the system is balanced, which is the case for a differential system, the usage of a CMF should double the impedance for the ESD stress. Consequently, employing a CMF allows the same residual pulse reduction at the IC level even in board assemblies where first impedance 120 may be only half the value (for instance distance of board layout) it would have to be in an arrangement without CMF.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the integrated method applies to any type of external clamp (TVS) including Zener diodes, RC networks, polymer materials, and related transient voltage suppressors. As another example, the PCB-related impedance may be a series of impedances in a row, or a set of distributed impedances, as long as the sum value adds up to the value of the desired isolation impedance.

As another example, the blocking impedance may be an inductor or a series combination of an inductor and a resistor.

As yet another example, the concept of the invention can be applied to a methodology wherein the residual pulse current is considered as a function of time, which needs to be reduced to a level which can withstand the breakdown characteristic of the IC pin.

It is therefore intended that the appended claims encompass any such modifications or embodiments.

We claim:

1. An electronic system protected against an incoming energy pulse, comprising:
   a semiconductor device connected in sequential order to a first impedance, a coupling noise filter having an internal frequency-dependent second impedance, a third impedance, a transient voltage suppressor, a fourth impedance, and an entry port exposed to the incoming energy pulse;
   the fourth impedance suitable for supporting the transient voltage suppressor in discharging a portion of the incoming energy pulse up to the full capability of the suppressor;
   the third impedance suitable for supporting and synchronizing the performance of the coupling noise filter to filter common mode noise from two phase lags between differential signals; and
   the first impedance suitable for diminishing, in combination with the second impedance as operational in the active frequency regime, the un-discharged portion of the energy pulse to a value under the device threshold failure current.

2. The system of claim 1 wherein the first impedance is frequency dependent (RLC).

3. The system of claim 1 wherein the coupling noise filter is a common mode filter suitable for differential device pins requiring high frequency response.

4. The system of claim 1 wherein the coupling noise filter is a chip ferrite inductor suitable for a device pin not requiring high frequency response.

5. An electronic system protected against an incoming energy pulse, comprising:
   a semiconductor device connected in sequential order to a layout impedance, a transient voltage suppressor, a tying impedance, and an entry port exposed to the incoming energy pulse;
   the tying impedance suitable for supporting the transient voltage suppressor in discharging a portion of the incoming energy pulse up to the full capability of the suppressor; and
   the layout impedance being frequency dependent (RLC) and suitable for diminishing the un-discharged portion of the energy pulse to a value under the device threshold failure current.

6. A method for fabricating an electronic system protected against an incoming energy pulse, comprising the steps of:
   connecting in sequential order a semiconductor device, a first impedance, a coupling noise filter having an internal frequency-dependent second impedance, a third impedance, a transient voltage suppressor, a fourth impedance, and an entry port exposed to the incoming energy pulse;
   selecting the fourth impedance to support the transient voltage suppressor in discharging a portion of the incoming energy pulse up to the full capability of the suppressor;
   selecting the third impedance to support and synchronize the performance of the coupling noise filter in filtering common mode noise from two phase lags between differential signals;
   analyzing the second impedance in the frequency regime applicable for the coupling noise filter operation; and
   selecting the first impedance to diminish, in combination with the second impedance as operational in the active frequency regime, the un-discharged portion of the energy pulse to a value under the device threshold failure current.

7. The method of claim 6 wherein the first impedance is frequency dependent (RLC).

8. The method of claim 6 wherein the coupling noise filter is a common mode filter suitable for differential device pins requiring high frequency response.

9. The system of claim 6 wherein the coupling noise filter is a chip ferrite inductor suitable for a device pin not requiring high frequency response.

10. A method for fabricating an electronic system protected against an incoming energy pulse, comprising the steps of:
    connecting in sequential order a semiconductor device, a layout impedance, a transient voltage suppressor, a tying impedance, and an entry port exposed to the incoming energy pulse;
    selecting the tying impedance to support the transient voltage suppressor in discharging a portion of the incoming energy pulse up to the full capability of the suppressor; and
    selecting the layout impedance as frequency dependent, operable to diminish the un-discharged portion of the energy pulse to a value under the device threshold failure current.

* * * * *